US008026596B2

(12) United States Patent
Singhal et al.

(10) Patent No.: US 8,026,596 B2
(45) Date of Patent: Sep. 27, 2011

(54) THERMAL DESIGNS OF PACKAGED GALLIUM NITRIDE MATERIAL DEVICES AND METHODS OF PACKAGING

(75) Inventors: Sameer Singhal, Raleigh, NC (US); Andrew Edwards, Cary, NC (US); Chul H. Park, Cary, NC (US); Quinn Martin, Morrisville, NC (US); Isik C. Kizilyalli, Raleigh, NC (US)

(73) Assignee: International Rectifier Corporation, El Segundo, CA (US)

( * ) Notice: Subject to any disclaimer, the term of this patent is extended or adjusted under 35 U.S.C. 154(b) by 1007 days.

(21) Appl. No.: 11/839,030

(22) Filed: Aug. 15, 2007

(65) Prior Publication Data
US 2010/0140665 A1    Jun. 10, 2010

(51) Int. Cl.
*H01L 23/373* (2006.01)
*H01L 21/58* (2006.01)

(52) U.S. Cl. ............... 257/712; 257/720; 257/E23.109; 438/122

(58) Field of Classification Search ............ 257/E23.109
See application file for complete search history.

(56) References Cited

U.S. PATENT DOCUMENTS

| 7,557,421 B1 * | 7/2009 | Shealy et al. ............... 257/499 |
| 2006/0043579 A1 * | 3/2006 | He et al. ................... 257/712 |
| 2007/0131970 A1 * | 6/2007 | Mittereder et al. .......... 257/194 |
| 2007/0272957 A1 * | 11/2007 | Johnson et al. ............. 257/289 |
| 2009/0109646 A1 * | 4/2009 | Kizilyalli et al. ........... 361/820 |

FOREIGN PATENT DOCUMENTS
WO   WO 2007/046773 A1  *  4/2007
* cited by examiner

*Primary Examiner* — Stephen W Smoot
(74) *Attorney, Agent, or Firm* — Farjami & Farjami LLP

(57) ABSTRACT

Gallium nitride material devices and methods associated with the devices are described. The devices may be designed to provide enhanced thermal conduction and reduced thermal resistance. The increased thermal conduction through and out of the gallium nitride devices enhances operability of the devices, including providing excellent RF operation, reliability, and lifetime.

16 Claims, 10 Drawing Sheets

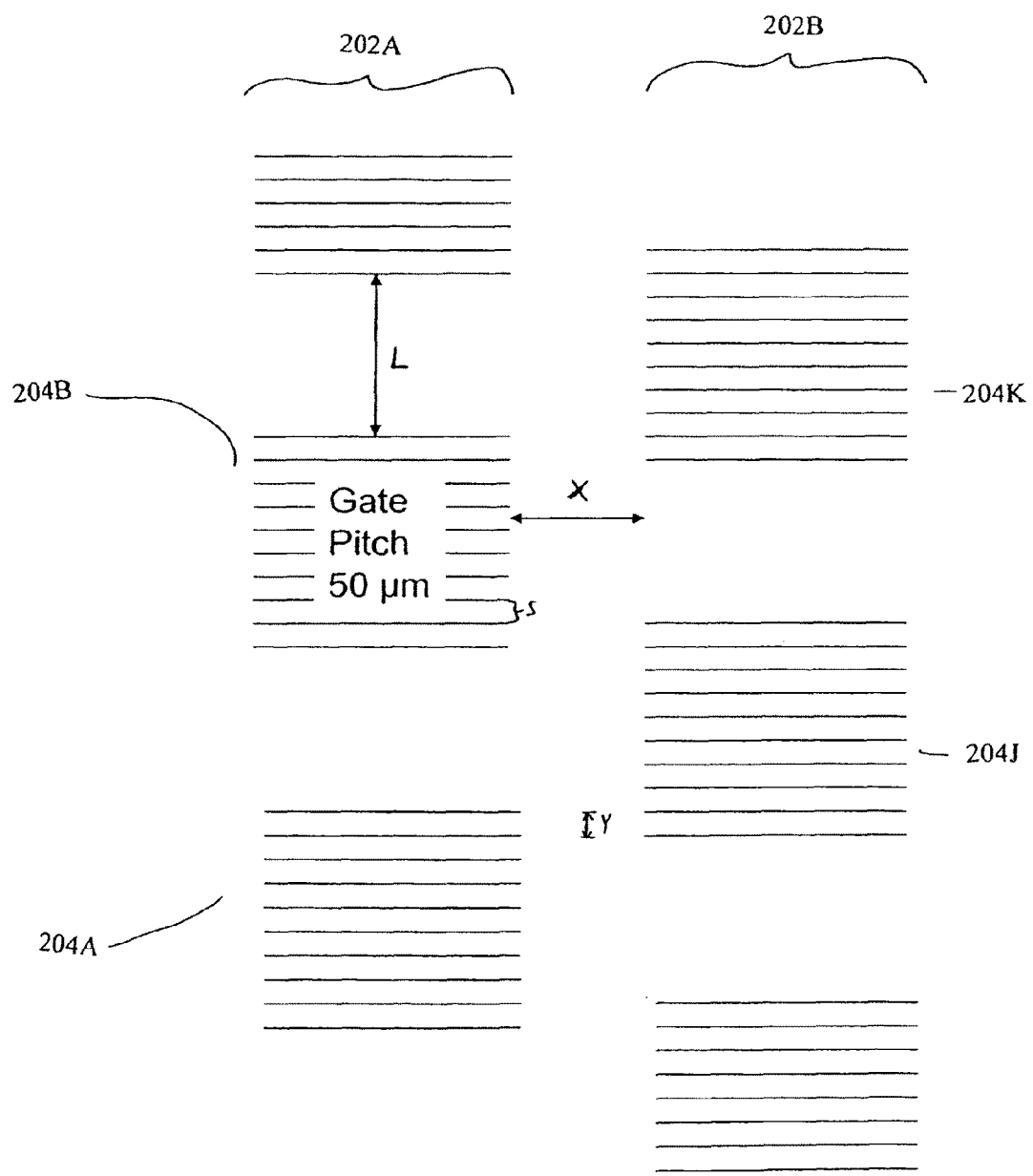

THERMAL DESIGNS OF PACKAGED GALLIUM NITRIDE MATERIAL DEVICES AND METHODS OF PACKAGING

FIELD OF INVENTION

The invention relates generally to gallium nitride material devices and, more particularly, to the thermal design of gallium nitride material devices, e.g., transistors, and methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Gallium nitride materials have a number of attractive properties including high electron mobility, the ability to efficiently emit blue light, and the ability to transmit signals at high frequency, amongst others. Accordingly, gallium nitride materials are being investigated in many microelectronic applications such as transistors and optoelectronic devices.

Despite the attractive properties noted above, a number of challenges exist in connection with developing gallium nitride material devices. For example, thermal considerations should be taken into account in the design of gallium nitride material devices, so as to enable electronic devices to reach their potential to operate with high power densities. Increased device temperature can have adverse affects on the performance of devices. For instance, increased device temperature can result in lower carrier mobility, lower sheet charge density, lower effective saturation velocity, and higher leakage currents, effectively limiting the ability of the device to produce RF power. Accordingly, heat should be removed efficiently from the vicinity of its generation to the outside environment to keep device temperatures below a desired limit.

SUMMARY OF INVENTION

Gallium nitride material devices and methods associated with the same are provided.

In one aspect, a gallium nitride material device is provided. The device comprises a plurality of transistors arranged in a plurality of cells. The transistors within each cell including a gallium nitride material active region, a source electrode, a drain electrode and a gate electrode. The gate electrode of each transistor within a cell is separated from the gate electrode of an adjacent transistor within the cell by a gate pitch. Each cell is separated from an adjacent cell by an inter-cell spacing, wherein each inter-cell spacing is greater than each gate pitch.

In another aspect, a gallium nitride material device is provided. The device comprises a plurality of transistors arranged in a first row and a second row. The first row and second row are approximately parallel to each other. Each transistor includes a gallium nitride material active region, a source electrode, a drain electrode and a gate electrode. The transistors of the first row are arranged in a first plurality of cells and the transistors of the second row are arranged in a second plurality of cells. The first plurality of cells is staggered from the second plurality of cells such that transistors of a first cell of the first plurality of cells are not horizontally aligned with transistors of a first cell of the second plurality of cells.

In another aspect, a packaged gallium nitride material device is provided. The device comprises a package; and, a gallium nitride material device comprising at least one transistor structure including a gallium nitride material region and source, gate and drain electrodes. The gallium nitride material device has a total gate width of at least 36 mm. The gallium nitride material device is supported by the package. The packaged device is configured to have a total thermal resistance of less than 1.5° C./W.

In another aspect, a packaged gallium nitride material device is provided. The device comprises a package; and, a gallium nitride material device comprising at least one transistor structure including a gallium nitride material region and source, gate and drain electrodes. The gallium nitride material device has a total gate width of at least 10 mm. The gallium nitride material device is supported by the package. The packaged device is configured to have a total thermal resistance of less than 4.0° C./W In another aspect, a packaged gallium nitride material device is provided. The device comprises a package including a supporting portion consisting essentially of copper. The device further comprises a gallium nitride material device comprising at least one transistor structure including an active region formed in a gallium nitride material region. The gallium nitride material device is supported by the supporting portion of the package.

In another aspect, a method of forming a gallium nitride material device is provided. The method comprises providing a plurality of transistors arranged in a plurality of cells. The transistors within each cell include a gallium nitride material active region, a source electrode, a drain electrode and a gate electrode. The gate electrode of each transistor within a cell being separated from the gate electrode of an adjacent transistor within the cell by a gate pitch. Each cell being separated from an adjacent cell by an inter-cell spacing, wherein each inter-cell spacing is greater than each gate pitch.

In another aspect, a method of forming a gallium nitride material device is provided. The method comprises providing a plurality of transistors arranged in a first row and a second row. The first row and second row are approximately parallel to each other. Each transistor includes a gallium nitride material active region, a source electrode, a drain electrode and a gate electrode. The transistors of the first row are arranged in a first plurality of cells and the transistors of the second row are arranged in a second plurality of cells. The first plurality of cells is staggered from the second plurality of cells such that transistors of a first cell of the first plurality of cells are not horizontally aligned with transistors of a first cell of the second plurality of cells.

In another aspect, a method of packaging a gallium nitride material device is provided. The method comprises forming a gallium nitride material device comprising at least one transistor structure including a gallium nitride material region; and, attaching the substrate to a pre-bowed copper material package.

In another aspect, a gallium nitride material device is provided. The device comprises a plurality of transistors. The transistors comprise a gallium nitride material region. The transistors further comprises a source electrode, a drain electrode and a gate electrode associated with the gallium nitride material region. An active region is defined in the gallium nitride material region between an edge of the source electrode closest to the gate electrode and an edge of the drain electrode closest the gate electrode. The device includes a via that surrounds at least the active region of at least one transistor.

In another aspect, a gallium nitride material device is provided. The device comprises a plurality of transistors. The transistors comprise a metal region and a gallium nitride material region. The transistors further comprise a source electrode, a drain electrode and a gate electrode associated with the gallium nitride material region. The metal region is separated from the gate electrode by a vertical separation distance between 0.5 micron and 50 micron.

In another aspect, a method of producing a gallium nitride material device is provided. The method comprises providing a plurality of transistors. The transistors comprising a gallium nitride material region. The transistors further comprise a source electrode, a drain electrode and a gate electrode associated with the gallium nitride material region. An active region is defined in the gallium nitride material region between an edge of the source electrode closest to the gate electrode and an edge of the drain electrode closest the gate electrode. The method further comprises providing at least one via that surrounds at least the active region of at least one transistor.

In another aspect, a method of producing a gallium nitride material device is provided. The transistors comprise a metal region and a gallium nitride material region formed over the metal region. The methods further comprise a source electrode, a drain electrode and a gate electrode associated with the gallium nitride material region. The metal region is separated from the gate electrode by a vertical separation distance between 0.5 micron and 50 micron. The method comprises forming the gallium nitride material region; forming a source electrode, a drain electrode and a gate electrode associated with the gallium nitride material region; and, forming the metal region.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF THE DRAWINGS

FIG. 2B is a schematic representation of a portion of the unit cell configuration of FIG. 2A;

DETAILED DESCRIPTION

The invention provides gallium nitride material devices and methods associated with the same. The devices may be designed to provide enhanced thermal conduction through and out of the device, while maintaining excellent electrical properties. For instance, the device may include a layout of transistors designed to increase removal of heat from the device. In some cases, the layout involves grouping the transistors into cells and spacing the cells an appropriate distance from each other. In some cases, the layout may involve placing the cells in a staggered configuration. As described further below, the heat flow through and out of gallium nitride devices may also be improved by using thermally conductive packaging arrangements and/or by removing selective portions (or all) of the substrate on which gallium nitride material regions are disposed. Amongst other advantages, the increased thermal conduction through and out of the gallium nitride material devices improves performance by enabling devices to operate at high power densities, as well as increasing reliability and lifetime.

Figure 1A:
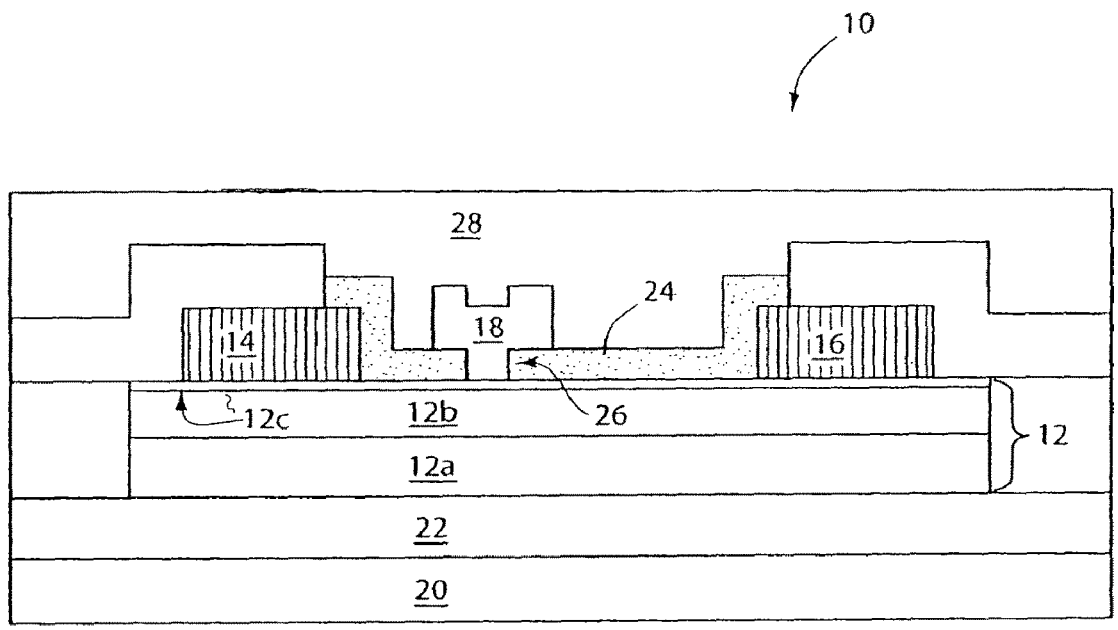
FIG. 1A is a cross-section of a gallium nitride material transistor building block structure that may be a portion of a gallium nitride material device according to one embodiment of the invention.
Figure 1B:
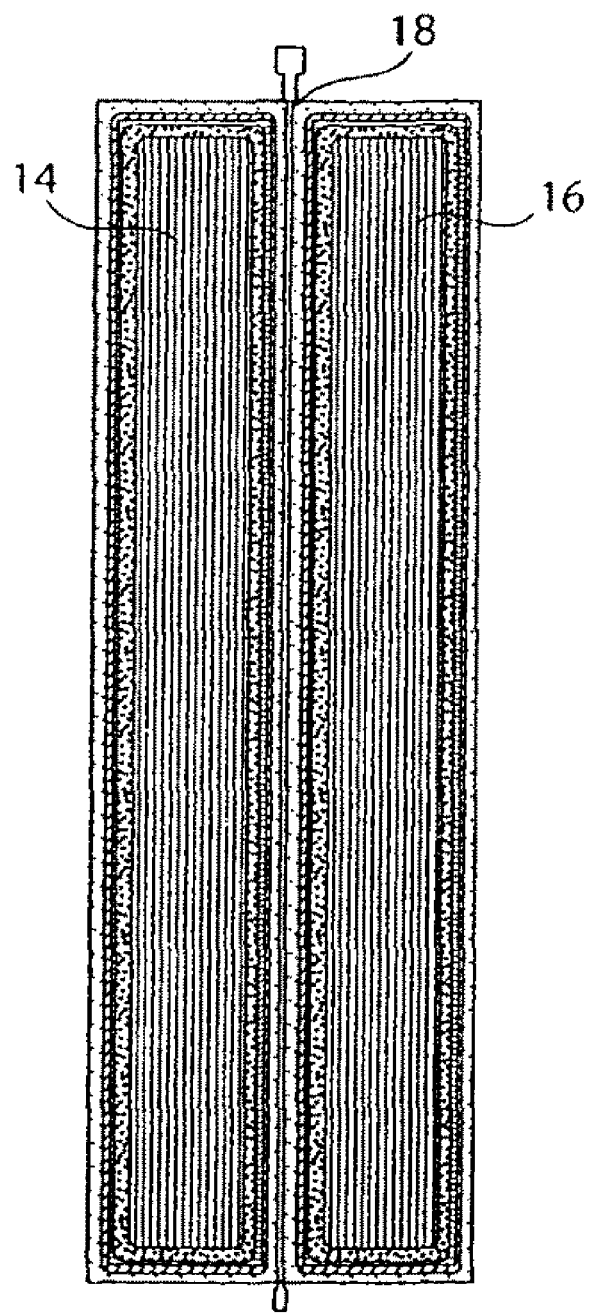
FIG. 1B is a top view of a transistor building block structure.

FIGS. 1A and 1B respectively illustrate a cross-section and top view of a transistor building block structure 10 that may be incorporated into a gallium nitride material device. It should be understood that the transistor building block structure 10 is described as an example only, and that the invention is not limited to use of such a structure. Structure 10 includes a gallium nitride material region 12. The transistor structure also includes a source electrode 14, a drain electrode 16 and a gate electrode 18 formed on the gallium nitride material region. The gallium nitride material region is formed on a substrate 20 and, as shown, a transition layer 22 may be formed between the substrate and the gallium nitride material region. The transistor includes a passivating layer 24 that protects and passivates the surface of the gallium nitride material region. A via 26 is formed within the passivating layer in which the gate electrode is in part formed. An encapsulation layer 28 is formed over the gate electrode and passivation layer, amongst other features.

It should be understood that the transistor structure shown in FIG. 1A is illustrative, but should not be considered limiting. Other transistor structures, or other active or passive elements, may be used within the gallium nitride material devices according to aspects of the present invention. As used herein, the term "device" may be an operable semiconductor device (e.g., a transistor) or a semiconductor device structure that needs additional processing to form an operable device.

Also, when a structure (e.g., layer, region) is referred to as being "on", "over" or "overlying" another structure, it can be directly on the structure, or an intervening structure (e.g., layer, region) also may be present. A structure that is "directly on" or "in contact with" another structure means that no intervening structure is present. It should also be understood that when a structure is referred to as being "on", "over", "overlying", or "in contact with" another structure, it may cover the entire structure or a portion of the structure.

A plurality of building block structures 10 may be combined to construct a power transistor device. Suitable ways of combining the building block structures are known to those of skill in the art and have been described in commonly-owned U.S. Pat. No. 7,135,720 which is incorporated herein by reference and is based on U.S. patent application Ser. No. 10/913,297, filed Aug. 5, 2004.

Figure 1C:
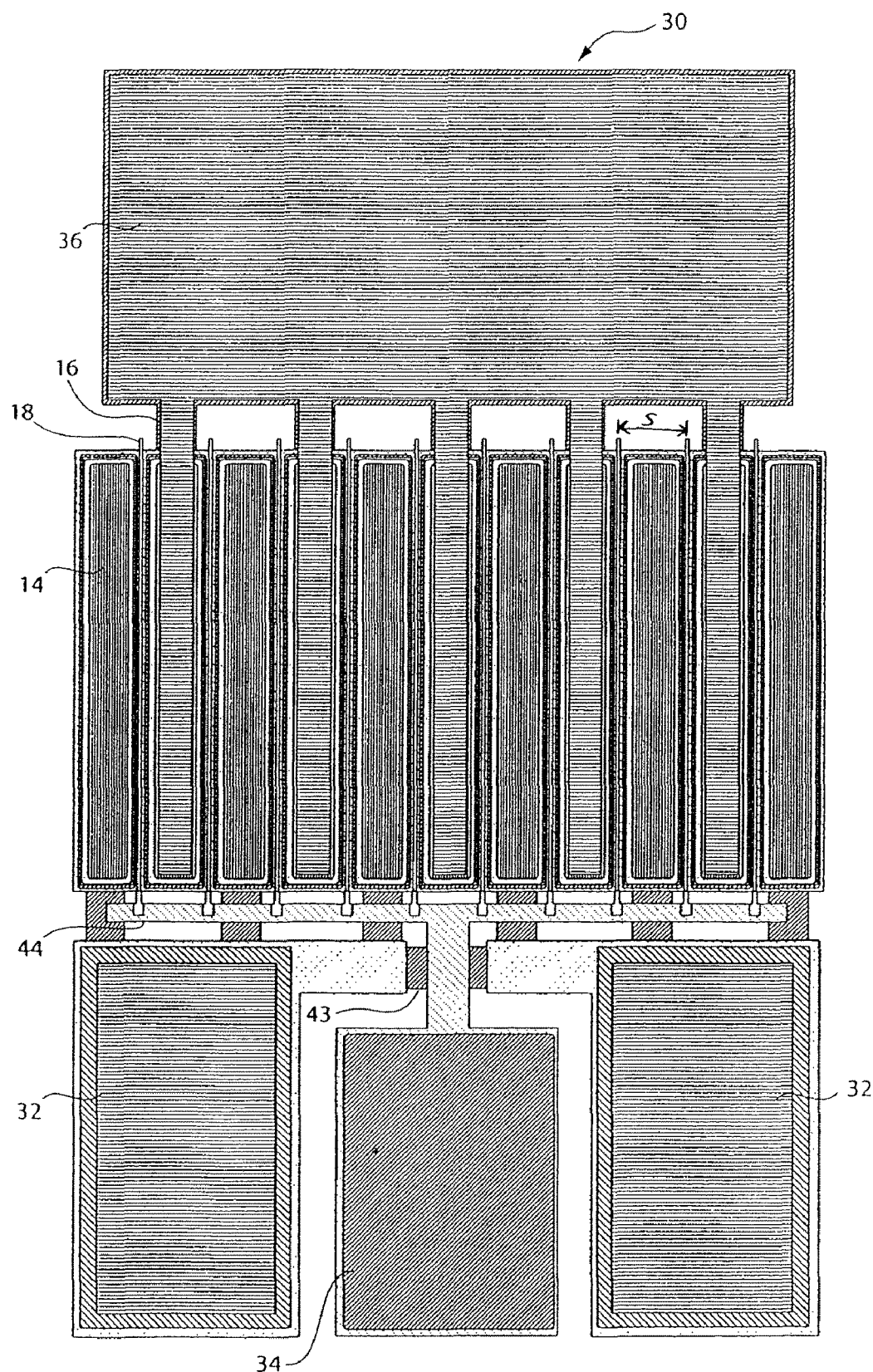
FIG. 1C is a plan view of a transistor unit cell.

The transistor building block structures 10 of FIGS. 1A and 1B may be grouped into unit cells. FIG. 1C is a plan view of a transistor unit cell 30. The transistor unit cell includes ten transistor building block structures. As shown, the source electrodes in the unit cell are connected to a common source pad 32; the gate electrodes are connected to a common gate pad 34; and, the drain electrodes are connected to a common drain pad 36. In the illustrative unit cell, ten gate electrodes are connected to the gate pad, six source electrodes are connected to source pad, and five drain electrodes are connected to the drain pad. It should be understood that the transistor unit cell 30 is provided as an example, and other configurations of a unit cell are possible. For example, the transistor unit cell may include a different number of building block structures and/or have different types of electrode and pad connections.

As shown in FIG. 1C, the gates of the transistor building block structures are spaced by a gate pitch S. The gate pitch represents the distance from one gate to the gate of an adjacent transistor building block. For instance, the gate pitch may be measured from the centerline of one gate to the centerline of the gate of an adjacent transistor building block structure. In the illustrated configuration, the gate pitch S is uniform (i.e., the same) between the gates of adjacent transistor building blocks. However, the unit cell does not need to have uniform gate spacing between the transistor building blocks, and may have different gate spacings in some embodiments.

Figure 2A:
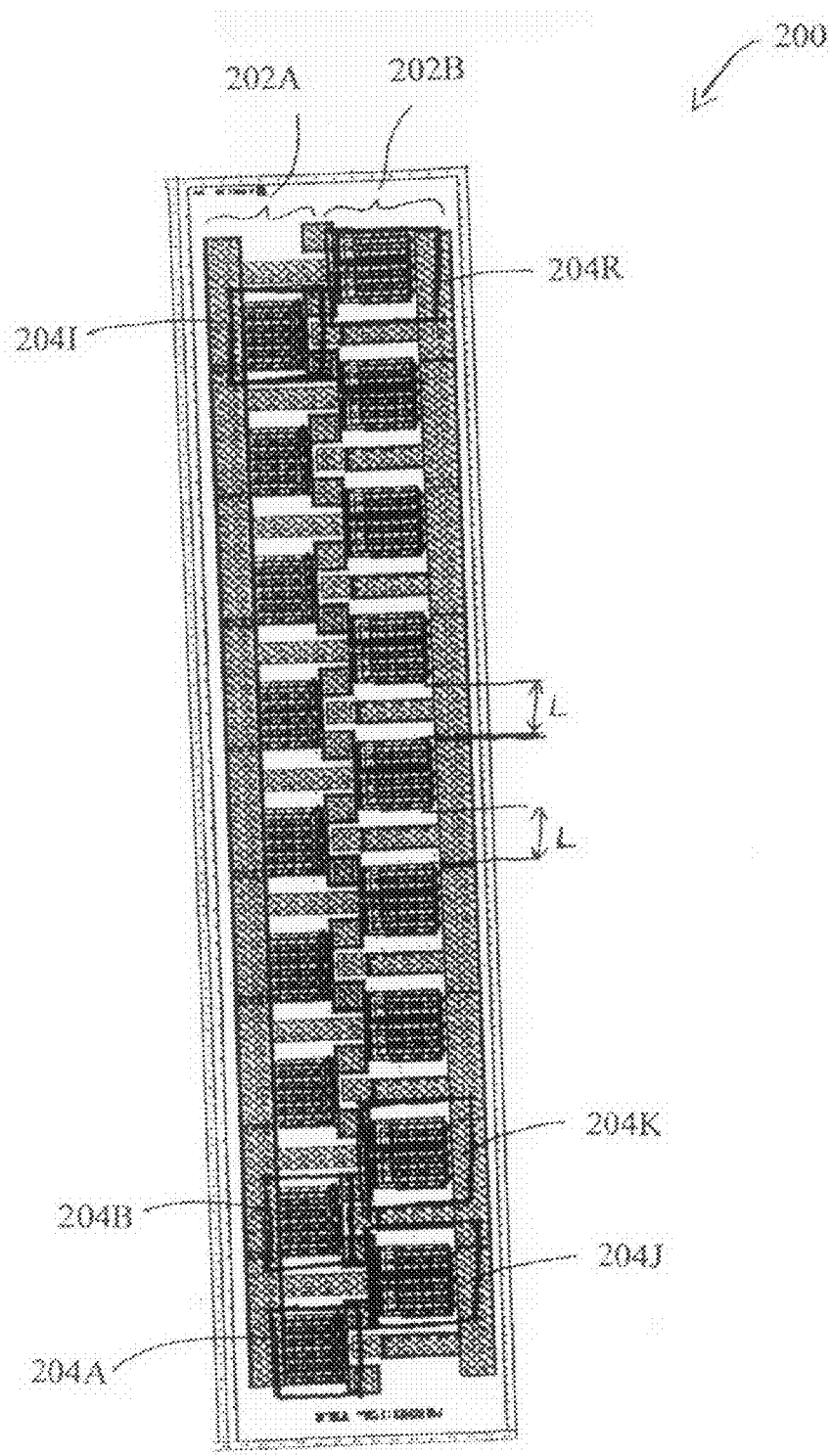
FIG. 2A is a top view of a unit cell configuration according to one embodiment of the present invention.

Some devices, such as radio-frequency (RF) gallium nitride power transistor devices, may use many transistor building block structures arranged in multiple unit cells. Proper configuration of unit cells can provide efficient conduction of heat generated by the transistor building block structures of the unit cells. FIG. 2A is a top view of a unit cell configuration of a gallium nitride material device 200 according to one embodiment of the present invention. The arrangement of the unit cells reduces thermal resistance, thereby increasing thermal conduction, while also maintaining good RF parasitics.

The gallium nitride material device 200 comprises two rows, 202A and 202B, of unit cells. In the illustrated embodiment, each row comprises nine unit cells. However, the invention is not limited in the number of rows or the number of unit cells provided. For instance, the gallium nitride material device 200 may comprise between two and four rows, or any appropriate number of rows. In addition, each row may contain between two and ten unit cells, or any appropriate number of unit cells. In the illustrated embodiment, row 202A comprises unit cells 204A, 204B, ..., 204I. Row 202B comprises unit cells 204J, 204K, ..., 204R. In the illustrated embodiment, the unit cells 204 are identical. Furthermore, the unit cells 204 are identical to the unit cell 30 of FIG. 1C.

Multiple aspects of the layout of the unit cells 204 illustrated in FIG. 2A contribute to efficient thermal conduction. For example, the configuration of unit cells within each row can enhance thermal conduction through and out of device 200. In row 202A, the unit cells have an inter-cell spacing of L. Inter-cell spacing L may be chosen appropriately to increase thermal conduction. FIG. 2B is a schematic of a portion of the unit cell configuration illustrated in FIG. 2A. As shown in FIG. 2B, the inter-cell spacing may be greater than the gate pitch S of the transistor building block structures within each unit cell. The inter-cell spacing L may be at least two times greater than gate pitch S. In some embodiments, the inter-cell spacing L may be at least three times the gate pitch S, or at least four times the gate pitch S. In some embodiments, it may be preferable for the inter-cell spacing to be less than ten times, or less than eight times, the gate pitch S. Other spacings may also be appropriate and it should be recognized that the absolute values of the inter-cell spacing L and the gate pitch S may depend on the particular device. Suitable ranges for L include between 100 microns and 1000 microns (e.g., 300 microns), or between 50 and 300 microns. Suitable ranges for the gate pitch S include between 10 microns and 100 microns (e.g., 50 microns), or between 15 and 60 microns. In some embodiments, the gate pitch S within each unit cell is not uniform. When the gate pitch S is not uniform, the inter-cell spacing L may be chosen so that L is greater than each gate pitch S within the unit cells; and, in some cases, at least two times, three times, or four times greater than the maximum gate pitch.

Another aspect of the layout of unit cells 204 illustrated in FIGS. 2A and 2B involves the relative placement of the rows 202A and 202B. As shown in FIGS. 2A and 2B, the rows 202A and 202B are staggered such that the units cells of row 202A are not horizontally aligned with the unit cells in row 202B. The "horizontal alignment" (or lack thereof) of a unit cell and another unit cell may be assessed by comparing a relative position on one unit cell to the same relative position on the other unit. For example, rows 202A and 202B are not horizontally aligned since the uppermost gate (G1) of one unit cell in row 202A is not horizontally aligned with the uppermost gate (G2) of a unit cell in row 202B. The staggered layout of the unit cells provides additional pathways for heat flow that are not present when the unit cells are horizontally aligned with each other.

The degree to which the rows 202A and 202B are staggered can be chosen to optimize thermal conduction while taking into account other design factors, such as the surface area required for the unit cell layout, electrical coupling, or other performance criteria. For example, as illustrated in FIG. 2B, the rows 202A and 202B may be staggered such that the unit cells of row 202A overlap the unit cells of row 202B in the y-direction by an amount Y. In the schematic of FIG. 2B, the overlap Y is approximately equal to the gate pitch S of the transistor building block structures within the unit cells 204. However, the overlap Y can be chosen to be any appropriate distance and the invention is not limited in this respect. For example, the gallium nitride material device 200 may be configured to provide no overlap in the y-direction between the units cells of rows 202A and 202B. In some embodiments, the overlap Y is between one and three times the gate pitch S. In some embodiments, the overlap Y is less than five times the gate pitch S. In absolute values, the overlap Y may be between 0 and 250 microns (e.g., 50 microns), or any appropriate value.

Another aspect of the layout of unit cells 204 illustrated in FIGS. 2A and 2B involves the relative placement of the rows 202A and 202B. As illustrated in FIG. 2B, the rows 202A and 202B are spaced by an inter-row spacing X. The inter-row spacing X provides for additional space between the unit cells 204 for thermal conduction. In one embodiment, the inter-row spacing is approximately three to four times greater than the gate pitch S. In some embodiments, the inter-row spacing is at least as great as the gate pitch S. In some embodiments, the inter-row spacing X is no greater than five times the gate pitch S. In absolute values, the inter-row spacing in some embodiments may be between 10 microns and 300 microns (e.g., 150 microns). However, any inter-row spacing may be chosen, and the invention is not limited in this respect.

It should be recognized that the specific configuration illustrated in FIGS. 2A and 2B is merely exemplary, and that the invention is not limited to those configurations. For example, more than one row of unit cells may be used. A row may comprise any number of unit cells. Alternatively, the unit cells need not be arranged into rows. In addition, the various dimensions, such as the gate pitch, the inter-cell spacing, the inter-row spacing, and the overlap may all be chosen to optimize thermal conduction through and out of the device, while taking into account other design criteria (e.g., electrical properties) for a given device application.

In some embodiments, portions, or all, of substrate 20 may be removed to enhance thermal conduction. Portions of the substrate may be removed to form one or more vias proximate the active region(s) of the transistor(s). As used herein, the term "active region" refers to a portion of the gallium nitride material region between the edge of the source electrode closest to the gate electrode and the edge of the drain electrode closest to the gate. For example, in embodiments which include one or more unit cells as described above, the via may define an area that surrounds the active regions of one, or more than one, of the transistors in a cell. It may be preferable for the via to surround the active region of each transistor in the cell. Such a via may be associated with each unit cell of the device.

It should be understood that the term "surround" in this context refers to vias that encompass the active region within the footprint defined by the via. It should be understood that the via may be formed entirely in regions below the active region including regions below the gallium nitride material region such as in the substrate.

In some embodiments, the via can surround a larger region than the active region. For example, the via may surround the source electrode, drain electrode and gate electrode of one, or more than one, of the transistors in a cell. In some embodiments, it may be preferable for the via to surround the source electrode, drain electrode and gate electrode of each transistor in a cell. Such a via may be associated with each unit cell of the device.

Figure 3A:
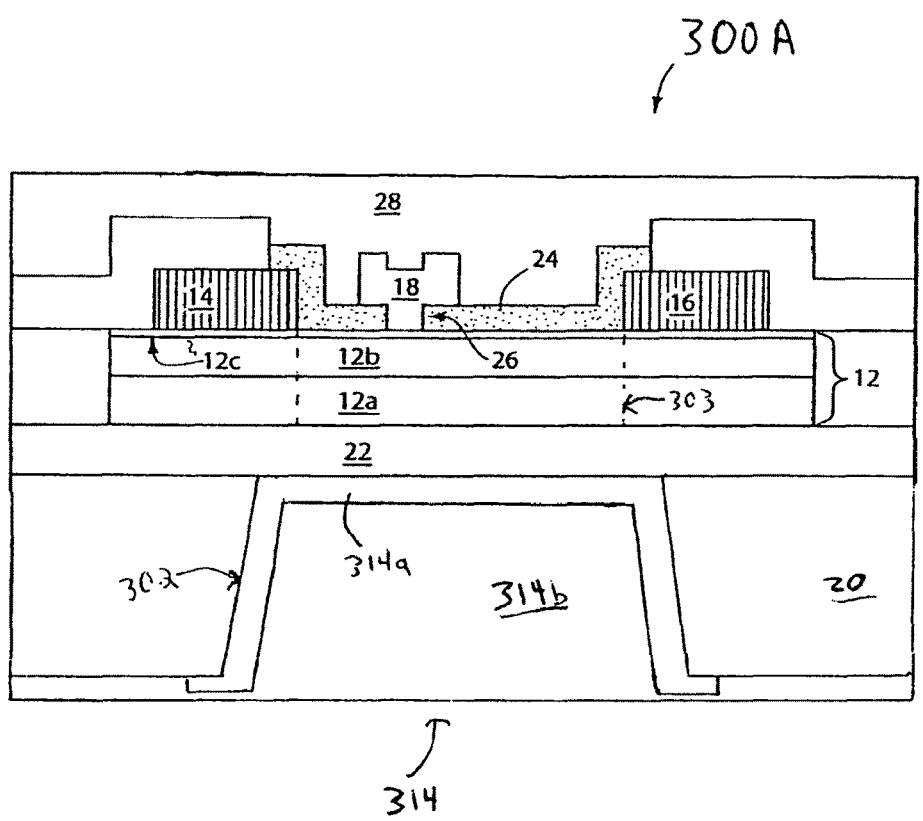
FIG. 3A is a cross-section of a gallium nitride material transistor building block including a via that surrounds an active region of the device according to an embodiment.
Figure 3B:
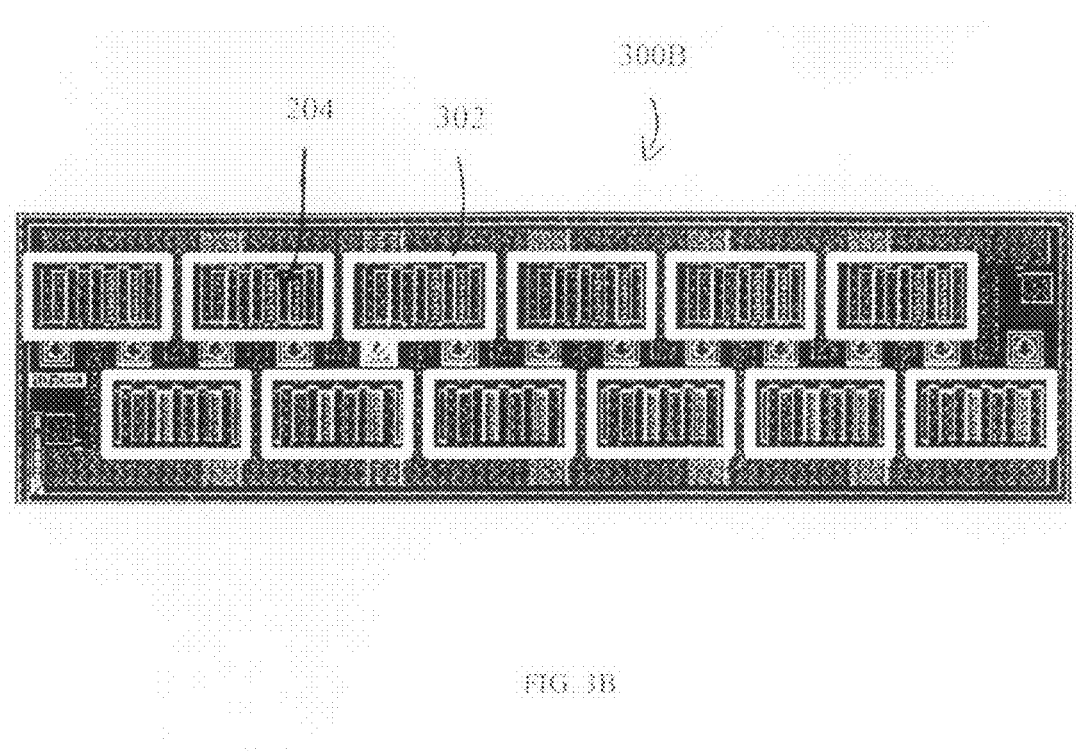
FIG. 3B shows a device including a plurality of vias that surround the source, gate and drain electrodes of each transistor in respective cells according to an embodiment.

FIGS. 3A and 3B show respective devices 300A and 300B including a plurality of vias 302 that surround active regions 303 of each transistor in respective cells 204. In device 300B, the vias also surround the source electrode, drain electrode and gate electrode of each transistor in respective cells 204.

However, it should be understood that devices of the invention may also include other vias that extend from a substrate surface that do not surround active regions. These vias may be present along with vias that do surround active regions but the primary purpose of such vias may be to provide an electrical conductive pathway, rather than to provide a thermal pathway. Such vias may extend all the way through the device, for example, from a source electrode to a backside of the device as described in commonly-owned U.S. patent application Ser. No. 11/634,332, filed Dec. 4, 2006, which is incorporated herein by reference. In some embodiments, the devices may be free of vias.

As shown in FIG. 3B, via 302 extends from a back surface 312 of substrate 20. The via may extend through the entire thickness of the substrate (as shown), or only a portion of the thickness. It is also possible for the via to extend into the overlying epitaxial layers including transition layer 22 and/or gallium nitride material region 12. In some cases, the substrate may be an SOI (silicon on insulator) substrate which includes a lower silicon portion, an insulator portion (e.g., silicon oxide) layer formed on the lower silicon portion and an upper portion. In these cases, the via may extend through the lower silicon portion ending at the insulating portion which can function as an etch stop during processing. In other embodiments, for example when a bulk silicon substrate is used, it may be advantageous for the via to extend through the entire thickness of the substrate to the overlying layer which may be a III-nitride-based transition layer.

As noted above, the via(s) may define an area that surrounds the active region in the overlying gallium nitride material region. Such a structure can be a particularly well-suited for heat removal as described further below. In other embodiments, the via may not surround the active region, but may only surround a portion of the active region.

The vias may be formed using any suitable technique such as etching.

In other embodiments, localized vias may not be formed and the substrate, for example, may be thinned across its entire area. It may be advantageous to thin the substrate when the substrate comprises silicon in order to limit the effects of the relatively poor thermal conductivity properties of silicon on the overall thermal conduction from the device. The substrate may be thinned to a thickness of less than 120 micron, or less than 75 microns (e.g., 50 microns). In some cases, it may be preferable that the substrate is at least 10 microns thick to provide mechanical stability to the structure. However, in some embodiments, the entire substrate may be removed across the entire device, as described further below. When the entire substrate is removed, it may also be possible, to remove a portion, or all, of the transition layer 22 and a portion of the gallium nitride material region 12. In embodiments in which the entire substrate is removed, the devices are free of a substrate on which the gallium nitride material region is formed.

Substrate thinning and/or removal may be done using any suitable technique such as etching or grinding/polishing.

To enhance thermal conduction, a thermally conductive material region 314 may be formed, at least in part, in the via. The thermally conductive material region can lead to greater heat flow by providing a more highly conductive thermal pathway from the active region to ambient (e.g., in some cases, through a package which may also be thermally conductive as described further below). In some embodiments, the via may be entirely filled with thermally conductive material, though, in others only a portion of the via is filled. The thermally conductive material region may comprise a single thermally conductive material or a combination of more than one thermally conductive material (e.g., 314a, 314b as shown). The thermally conductive material(s) generally have a thermal conductivity (e.g., at room temperature) greater than that of the substrate, particularly if the substrate is silicon. Suitable materials include metals (e.g., copper, gold, silver) and dielectric materials (e.g., diamond, carbon-based materials including carbon nanotubes, aluminum nitride, and silicon carbide).

In some embodiments, the thermally conductive material region in the via includes a dielectric material portion 314a and a metal portion 314b. Though in some cases, the thermally conductive material region includes only a dielectric material portion, or only a metal portion. In some cases, when present, metal portion 314b may be grounded. As shown, the dielectric material portion separates the metal region from the epitaxial layers (e.g., transition layer 22, gallium nitride material region 12) above. It has been discovered that the separation distance between the metal portion and the gate electrode and/or the dielectric properties of the material(s) (e.g., dielectric material portion 314a, transition layer 22, gallium nitride material region 12) between the metal portion and the gate electrode can be important to the resulting electrical properties of the device. For example, proper selection of the separation distance and the dielectric constant can minimize (or reduce) power loss through capacitance effects that could arise as a result of the metal portion and the gate electrode.

In some embodiments, it may be desirable for the dielectric constant to be 15 or less; in some cases, 10 or less (e.g., 8-9). In some embodiments, the vertical separation distance between the metal portion and the gate electrode is between 0.5 microns and 50 microns; and, in some cases, between 5 microns and 50 microns. In some embodiments, the vertical separation distance may be between 0.5 microns and 2.5 microns, or 0.5 microns and 5.0 microns. Other ranges may also be suitable and, for example, may depend on the dielectric constant of the material separating the metal portion and the gate electrode. In some embodiments, it may be preferable for the vertical separation distance between the metal portion and the gate electrode to be greater than the lateral separation distance between the gate electrode and the drain electrode.

It should be understood that the above discussion related to thermally conductive regions being formed in via(s) also generally pertains to embodiments in which the substrate is thinned and/or removed. That is, the above-noted thermally conductive material regions (including material regions having a dielectric material portion and a metal portion) may be formed on the backside of a thinned substrate, or the backside of the epitaxial layer stack (e.g., transition layer 22, gallium nitride material region 12) when the substrate is removed.

The thermally conductive material region may be formed using conventional deposition or bonding techniques depending on the material type and layer configuration. For example, when the thermally conductive material region is formed in a via, the region may be deposited/patterned using suitable conventional techniques; and, when the thermally conductive material region is formed on the backside of a thinned substrate or backside of the epitaxial layer stack, the thermally conductive material region may be deposited or may be bonded to the appropriate backside using conventional techniques.

It should be understood that not every embodiment of the invention includes a via and/or a thermally conductive material region to enhance thermal conduction.

Figure 4:
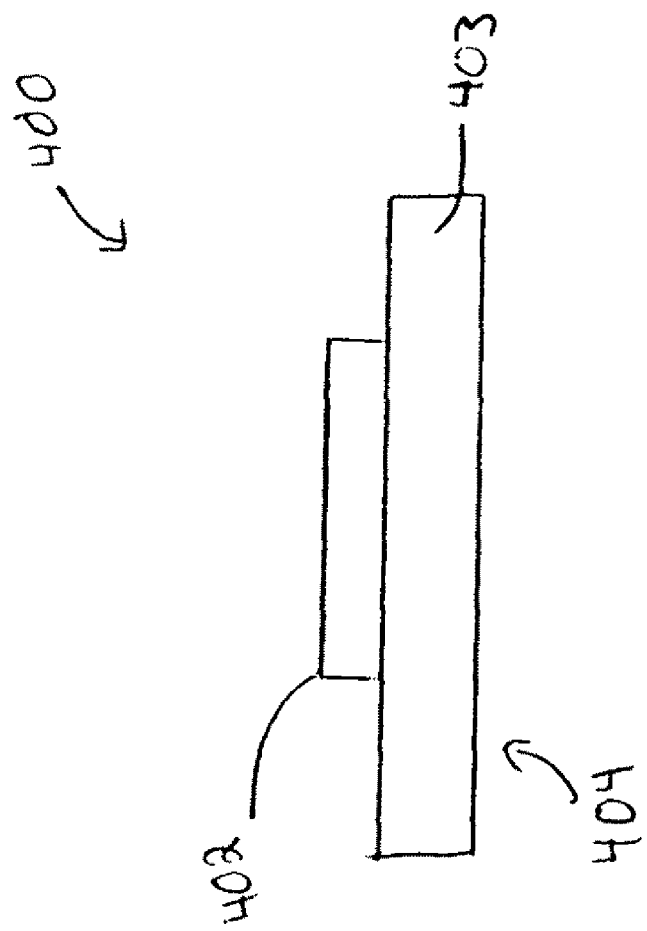
FIG. 4 is a schematic representation of a packaged device.

The devices described herein may be packaged as shown in FIG. 4. Packaged device 400 includes device 402 mounted on a supporting portion 403 of a package 404. In some embodiments, the package may also include an upper portion (not shown) which surrounds or encapsulates the top of the device. The upper portion, if present, may be formed of a ceramic or polymeric material, for example.

The package, and in particular the supporting portion, 404 may also be configured to enable efficient thermal conduction. For example, the package may comprise a suitable thermally conductive material, such as a metal or dielectric material. In some embodiments, it may be preferable for the supporting portion to consist essentially of copper (i.e., non-alloyed copper). By packaging the die with a thermally conductive package, heat generated by the devices can be dissipated through the package to the ambient environment. In embodiments which include a thermally conductive material region 314 (e.g., within a via, on a backside of a thinned substrate, or on a backside, the thermally conductive material region 314 may be in thermal (e.g., direct) contact with the supporting portion of the package. For example, the thermally conductive material region may be copper and may be in thermal contact with the copper supporting portion.

To facilitate attachment of the device to the package, a pre-bowed package may be used, particularly when the package is a copper material. The extent of pre-bowing is selected so that the resulting interface 406 between the device and the package is substantially flat after processing. For example, the package may have a convex shape and may include a bow (i.e., maximum distance that a portion deviates from the original plane) of between 25 micron and 125 micron. The selection is based on an understanding of the different rates of expansion experienced by the package material and the device during attachment. A pre-bowed copper package may be stressed using conventional techniques prior to attachment to the device which leads to its bowing.

The process of attaching the device to the package can be accomplished by a eutectic attach process. In one embodiment, the device is attached to the package 304 using a gold-tin eutectic attach process. In embodiments that include a thermally conductive material region 314 in thermal (e.g., direct) contact with the thermally conductive packaging material; it may be preferable for the attaching material to be formed of a thermally and electrically conducting material (e.g., metal, certain epoxies) so that a thermally and electrically conducting pathway (e.g., formed entirely of metal) extends from the thermally conductive material in the device through the package. However, it should be understood that other attach processes are also possible.

In some embodiments, the combination of the above-described via/thermally conductive material region formation and packaging techniques may provide particularly good thermal conduction.

Gallium nitride material devices of the invention can have lower total thermal resistances than certain conventional devices by employing one or more of the above-described techniques for increasing thermal conduction. Thermal resistance is a measure of transmit heat from the device, and may be determined by the temperature rise divided by the power dissipated by the device (expressed in units of $°C./W_{dissipated\ power}$). The thermal resistance may be measured using known techniques such as IR imaging.

In some embodiments, a gallium nitride material device (based on transistors) having a total gate width of 36 mm (i.e., a 36 mm device) or larger can have a total thermal resistance, $R_{jc}$, of less than 1.5° C./W. In some embodiments, the total thermal resistance of a 36 mm (or larger) gallium nitride material device is less than 1.0° C./W. In some embodiments, the total thermal resistance of a 36 mm (or larger) gallium nitride material device is less than 0.85° C./W, or even less than 0.6° C./W. In some embodiments, a 10 mm or larger gallium nitride material device has a total thermal resistance less than approximately 4° C./W; or less than 2° C./W. It should be understood that the "total gate width" refers to the sum of the width of each gate electrode in the device.

The above-noted thermal properties may be achieved while maintaining excellent electrical properties, particularly for RF applications, including high drain efficiency, output power, and gain amongst other properties. The gallium nitride material devices (including the devices having the thermal properties noted above) described herein may achieve the electrical properties of devices described in commonly-owned U.S. Pat. No. 7,135,720 which is incorporated herein by reference and commonly-owned U.S. patent application Ser. No. 11/543,010 which is also incorporated herein by reference. For example, the devices can achieve the following properties.

Devices of the invention may operate at efficiencies of greater than or equal to 20% (e.g., between 22% and 30%). Efficiency (i.e., drain efficiency) is defined as the output power divided by the drain current multiplied by the drain voltage. In some embodiments, the devices operate at efficiencies of greater than or equal to 30%; and, in some embodiments, the devices operate at efficiencies of greater than or equal to 40%. In some cases, efficiencies of less than or equal to 50% may be desired to limit sacrifices to other properties. The efficiency may be controlled, in part, by the matching network, operating conditions and other design features (e.g., layer composition, gate length, gate pitch, amongst others).

Output power may be measured using standard techniques. It may be useful to express output power in terms of power density which is the output power divided by the gate periphery (W/mm). The output power depends largely on the size of the device. In some cases, the average output power is between about 0.5 W and about 40 W under OFDM modulation. Devices of the invention may have power densities of greater than or equal to 0.1 W/mm. In some embodiments, the power density may be greater than or equal to 0.5 W/mm; and, in some embodiments, the power density may be greater than or equal to 1.0 W/mm. In some cases, power densities of less than or equal to 10 W/mm may be desired to limit sacrifices to other properties. The power density may be controlled, in part, by the matching network, operating conditions and other design features (e.g., layer composition, gate length, gate pitch, amongst others).

The devices may also operate at sufficient gains for RF power transistors markets (including wideband applications). Gain is defined as the output power divided by the input power and may be expressed in units of dB. The devices may have a gain of greater than or equal to 5 dB. In some embodiments, the gain may be greater than or equal to 12 dB (e.g., between 12 and 15). In some cases, a gain of less than or equal to 18 dB may be desired to limit sacrifices to other properties.

In some cases, the devices are operated at drain voltages of up to 300 Volts. In some cases, the drain voltage may be up to 100 Volts or up to 50 Volts (e.g., 12 Volts, 28 Volts or 48 Volts). Suitable gate voltages may be between 0 Volts and −10 Volts.

The devices of the invention may be operated in frequency ranges between about 100 MHz and about 10 GHz; and, in some cases, within a frequency range of between about 1.8 and about 6 GHz (e.g., 3.3-3.8 GHz; or 2.3-2.7 GHz; or about 5.8 GHz). It should be understood that, in these embodiments, the input and/or output signal of the devices may be within these frequency ranges.

In some cases, devices of the invention may advantageously exhibit the above-noted property values (i.e., efficiency, output power, power density, gain) over a fairly wide frequency range. For example, the above-noted property values may be exhibited over a bandwidth of at least 100 MHz in some embodiments; or, in other embodiments, at least 200 MHz.

Referring again to FIG. 1, gallium nitride material region 12 of the transistor structure functions as the active region. That is, the conductive channel extending from the source electrode to the drain electrode is formed in the gallium nitride material region. The gallium nitride material region comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_aP_b N_{(1-a-b)}$), aluminum indium gallium arsenide phosphoride nitride ($Al_xIn_yGa_{(1-x-y)}As_aP_b N_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287 incorporated herein by reference.

In some cases, the gallium nitride material region includes only one gallium nitride material layer. In other cases, the gallium nitride material region includes more than one gallium nitride material layer. For example, the gallium nitride material region may include multiple layers (12a, 12b, 12c), as shown. In certain embodiments, it may be preferable for the gallium nitride material of layer 12b to have an aluminum concentration that is greater than the aluminum concentration of the gallium nitride material of layer 12a. For example, the value of x in the gallium nitride material of layer 12b (with reference to any of the gallium nitride materials described above) may have a value that is between 0.05 and 1.0 greater than the value of x in the gallium nitride material of layer 12a, or between 0.05 and 0.5 greater than the value of x in the gallium nitride material of layer 12a. For example, layer 12b may be formed of $Al_{0.26}Ga_{0.74}N$, while layer 12a is formed of GaN. This difference in aluminum concentration may lead to formation of a highly conductive region at the interface of the layers 12a, 12b (i.e., a 2-D electron gas region). In the illustrative embodiment, layer 12c may be formed of GaN.

Gallium nitride material region 12 also may include one or more layers that do not have a gallium nitride material composition such as other III-V compounds or alloys, oxide layers, and metallic layers.

The gallium nitride material region is of high enough quality so as to permit the formation of devices therein. Preferably, the gallium nitride material region has a low crack level and a low defect level. As described further below, transition layer 22 (particularly when compositionally-graded) may reduce crack and/or defect formation. Gallium nitride materials having low crack levels have been described in U.S. Pat. No. 6,649,287 incorporated by reference above. In some cases, the gallium nitride material region a crack level of less than 0.005 $\mu m/\mu m^2$. In some cases, the gallium nitride material region has a very low crack level of less than 0.001 $\mu m/\mu m^2$. In certain cases, it may be preferable for gallium nitride material region to be substantially crack-free as defined by a crack level of less than 0.0001 $\mu m/\mu m^2$.

In some embodiments, gallium nitride materials having low dislocation densities may be preferred. Suitable gallium nitride materials and processes for forming the same are described in commonly-owned, co-pending U.S. patent application Ser. No. 10/886,506, filed Jul. 7, 2004, entitled "III-Nitride Materials Including Low Dislocation Densities and Methods Associated With the Same".

In certain cases, the gallium nitride material region includes a layer or layers which have a monocrystalline structure. In some cases, the gallium nitride material region includes one or more layers having a Wurtzite (hexagonal) structure.

The thickness of the gallium nitride material region and the number of different layers are dictated, at least in part, by the requirements of the specific device. At a minimum, the thickness of the gallium nitride material region is sufficient to permit formation of the desired structure or device. The gallium nitride material region generally has a thickness of greater than 0.1 micron, though not always. In other cases, gallium nitride material region 12 has a thickness of greater than 0.5 micron, greater than 0.75 micron, greater than 1.0 microns, greater than 2.0 microns, or even greater than 5.0 microns.

As noted above, the device includes passivating layer 24 formed on the surface of gallium nitride material region 12. Suitable passivating layers (some of which also function as electrode-defining layers) have been described in commonly-owned, co-pending U.S. Pat. No. 7,071,498, filed Dec. 17, 2003, entitled "Gallium Nitride Material Devices Including an Electrode-Defining Layer and Methods of Forming The Same", which is incorporated herein by reference.

Suitable compositions for passivating layer 24 include, but are not limited to, nitride-based compounds (e.g., silicon nitride compounds), oxide-based compounds (e.g., silicon oxide compounds), polyimides, other dielectric materials, or combinations of these compositions (e.g., silicon oxide and silicon nitride). In some cases, it may be preferable for the passivating layer to be a silicon nitride compound (e.g., $Si_3N_4$) or non-stoichiometric silicon nitride compounds.

In certain preferred embodiments, substrate 20 is a silicon substrate. Silicon substrates may be preferred because they are readily available, relatively inexpensive and are of high crystalline quality.

As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used. In some cases, silicon (111) substrates are preferred. In other cases, silicon (100) substrates are preferred.

In certain preferred embodiments, the silicon substrate (or at least the silicon portion of the substrate for substrates that include a silicon portion formed on another material) is highly resistive. For example, the resistivity of the silicon substrate (or the silicon portion of the substrate) may be greater than or equal to about $10^2$ Ohms-cm. In some cases, the resistivity of the substrate (or the silicon portion of the substrate) may be greater than or equal to about $10^4$ Ohms-cm; or even, greater than or equal to about $10^5$ Ohms-cm.

Highly resistive silicon substrates may be particularly preferred in structures that are used to form devices that operate at high frequencies (e.g., RF devices). The high resistivity can reduce so-called substrate losses which otherwise may arise and sacrifice performance. These substrate losses may render silicon substrates with lower resistivities unsuitable in high frequency devices. Suitable highly resistive silicon substrate have been described in commonly-owned U.S. Patent Publication No. 2006-0118819 which is based on U.S. patent application Ser. No. 11/004,628 filed Dec. 3, 2004.

It should be understood that other types of substrates may also be used including sapphire, silicon carbide, indium phosphide, silicon germanium, gallium arsenide, gallium nitride material, aluminum nitride, or other III-V compound substrates. However, in embodiments that do not use silicon substrates, all of the advantages associated with silicon substrates may not be achieved.

Substrate 20 may have any suitable dimensions and its particular dimensions are dictated, in part, by the application and the substrate type. Suitable diameters may include, but are not limited to, 2 inches (50 mm), 4 inches (100 mm), 6 inches (150 mm), and 8 inches (200 mm).

In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, when using thinner substrates. In other embodiments, thinner substrates (e.g., less than 125 microns) are used. Though thinner substrates may not have the advantages associated with thicker substrates, thinner substrates can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). In the illustrative embodiments, the regions/layers formed on the substrate (e.g., transition layer, gallium nitride material region, and the like) may also be substantially planar. As described further below, such regions/layers may be grown in vertical (e.g., non-lateral) growth processes. Planar substrates and regions/layers can be advantageous in some embodiments, for example, to simplify processing. Though it should be understood that, in some embodiments of the invention, lateral growth processes may be used as described further below.

Transition layer 22 may be formed on substrate 20 prior to the deposition of gallium nitride material region 12. The transition layer may accomplish one or more of the following: reducing crack formation in the gallium nitride material region 12 by lowering thermal stresses arising from differences between the thermal expansion rates of gallium nitride materials and the substrate; reducing defect formation in gallium nitride material region by lowering lattice stresses arising from differences between the lattice constants of gallium nitride materials and the substrate; and, increasing conduction between the substrate and gallium nitride material region by reducing differences between the band gaps of substrate and gallium nitride materials. The presence of the transition layer may be particularly preferred when utilizing silicon substrates because of the large differences in thermal expansion rates and lattice constant between gallium nitride materials and silicon. It should be understood that the transition layer also may be formed between the substrate and gallium nitride material region for a variety of other reasons. In some cases, for example when a silicon substrate is not used, the device may not include a transition layer.

The composition of transition layer 22 depends, at least in part, on the type of substrate and the composition of gallium nitride material region 12. The transition layer may comprise a III-nitride material (i.e., gallium nitride (GaN), aluminum nitride (AlN), indium nitride (InN) and their respective alloys (e.g., AlGaN, InGaN, AlInGaN and AlInN)). In some embodiments which utilize a silicon substrate, the transition layer may preferably comprise a compositionally-graded transition layer having a composition that is varied across at least a portion of the layer. Suitable compositionally-graded transition layers, for example, have been described in commonly-owned U.S. Pat. No. 6,649,287, entitled "Gallium Nitride Materials and Methods," filed on Dec. 14, 2000, which is incorporated herein by reference. Compositionally-graded transition layers are particularly effective in reducing crack formation in the gallium nitride material region by lowering thermal stresses that result from differences in thermal expansion rates between the gallium nitride material and the substrate (e.g., silicon). In some embodiments, when the compositionally-graded, transition layer is formed of an alloy of gallium nitride such as $Al_xIn_yGa_{(1-x-y)}N$, $Al_xGa_{(1-x)}N$, or $In_yGa_{(1-y)}N$, wherein $0 \leq x \leq 1$, $0 \leq y \leq 1$. In these embodiments, the concentration of at least one of the elements (e.g., Ga, Al, In) of the alloy is typically varied across at least a portion of the cross-sectional thickness of the layer. For example; when the transition layer has an $Al_xIn_yGa_{(1-x-y)}N$ composition, x and/or y may be varied; when the transition layer has a $Al_xGa_{(1-x)}N$ composition, x may be varied; and, when the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within the gallium nitride material region. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer). The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

In some cases, the transition layer has a monocrystalline structure.

It should be understood that, in some embodiments, transition layer 22 has a constant (i.e., non-varying) composition across its thickness.

The source, drain and gate electrodes may be formed of any suitable conductive material such as metals (e.g., Au, Ni, Pt, Ti, Al, Ta, W), metal compounds (e.g., WSi, WSiN), alloys, semiconductors, polysilicon, nitrides, or combinations of these materials. In particular, the dimensions of the gate electrode can be important to device performance. In the illustrative embodiment, via 26 formed in the passivating layer defines (at least in part) the gate electrode dimensions. Thus, by controlling the shape of the via, it is possible to define desired gate dimensions. Suitable via and gate dimensions have been described in U.S. patent application Ser. No. 10/740,376, incorporated by reference above.

In some embodiments, electrodes may extend into the gallium nitride material region. For example, electrode material (e.g., metal) deposited on the surface of the gallium nitride material region may diffuse into the gallium nitride material region during a subsequent annealing step (e.g., RTA) when forming the electrode. In particular, the source and drain electrodes may include such a portion diffused into the gallium nitride material region. As used herein, such electrodes are still considered to be formed on the gallium nitride material region.

Source, gate and drain pads may be formed of any suitable conductive material such as metals (e.g., Au, Ni, Pt, Ti, Al, Ta, W), metal compounds (e.g., WSi, WSiN), alloys, semiconductors, polysilicon, nitrides, or combinations of these materials. In some embodiments, the pads are formed of the same material as the corresponding electrodes.

The device shown in FIGS. 1A and 1B also includes an encapsulation layer 28 which, as known to those of skill in the art, encapsulates underlying layers of the structure to provide chemical and/or electrical protection. The encapsulation layer may be formed of any suitable material including oxides or nitrides.

It should be understood that the transistor structure may include other layers. For example, the transistor structure may include additional features not shown in FIGS. 1A and 1B. For example, the transistor structure may include a strain-absorbing layer formed directly on the surface of substrate 20. Suitable strain-absorbing layers have been described in commonly-owned, co-pending U.S. Patent Application Publication No. 20050285141, which is incorporated herein by reference and is based on U.S. patent application Ser. No. 10/879,703, entitled "Gallium Nitride Materials and Methods Associated With the Same", filed Jun. 28, 2004. In one embodiment, it may be preferable for the strain-absorbing layer to be very thin (e.g., thickness of between about 10 Angstroms and about 100 Angstroms) and formed of an amorphous silicon nitride-based material.

In some embodiments, other layers (e.g., intermediate layers) may be present. Suitable intermediate layers, for example, have been described and illustrated in U.S. Pat. No. 6,649,287, which was incorporated by reference above. In other embodiments of the invention, layer(s) shown herein may not be present. Other variations to the structures and devices shown herein would be known to those of skill in the art and are encompassed by the present invention.

Structures and devices of the present invention may be formed using methods that employ conventional processing techniques. In general the stack of material layers is formed on a substrate which is later processed (e.g., diced) to form the desired final structure (e.g., transistor).

For example, the layers and regions of the transistor structure of FIGS. 1A and 1B may be formed, patterned, etched and implanted using conventional techniques.

Transition layer 22 and gallium nitride material region 12 may be deposited, for example, using metal organic chemical vapor deposition (MOCVD), molecular beam epitaxy (MBE), and hydride vapor phase epitaxy (HVPE), amongst other techniques. The preferred technique may depend, in part, on the composition of the layers. An MOCVD process may be preferred. A suitable MOCVD process to form a transition layer (e.g., a compositionally-graded transition layer) and gallium nitride material region over a silicon substrate has been described in U.S. Pat. No. 6,649,287 incorporated by reference above. When the semiconductor material region has different layers, in some cases it is preferable to use a single deposition step (e.g., an MOCVD step) to form the entire gallium nitride material region. When using the single deposition step, the processing parameters are suitably changed at the appropriate time to form the different layers. In certain preferred cases, a single growth step may be used to form the transition layer and the gallium nitride material region.

When present, the stress-absorbing layer may be formed using techniques described in U.S. patent application Ser. No. 10/879,703 which is incorporated by reference above.

Passivating layer 24 may be deposited using any suitable technique. The technique used, in part, depends on the composition of the passivating layer. Suitable techniques include, but are not limited to CVD, PECVD, LP-CVD, ECR-CVD, ICP-CVD, evaporation and sputtering. When the passivating layer is formed of a silicon nitride material, it may be preferable to use PECVD to deposit the layer.

When present, via 26 may be formed within the passivating layer using an etching technique. A plasma etching technique is preferably used to form the via with controlled dimensions Source, drain and gate electrodes may be deposited on the gallium nitride material region using known techniques such as an evaporation technique. In cases when the electrodes include two metals, then the metals are typically deposited in successive steps. The deposited metal layer may be patterned using conventional methods to form the electrodes. In some embodiments, an annealing step (e.g., RTA) may also be used in which the deposited electrode material diffuses into the gallium nitride material region, particularly when forming source and drain electrodes.

Suitable techniques for forming the passivating layer, via and electrodes have been described in commonly owned, co-pending U.S. patent application Ser. No. 10/740,376, which is incorporated herein by reference above.

Source, drain and gate electrode pads may also be deposited and patterned using known techniques.

In some embodiments, an isolation region may be formed which electrical isolates the active region. Suitable processes for forming isolation region have been described in commonly owned U.S. Patent Application Publication No. 2005/0145851, which is based on U.S. patent application Ser. No. 10/879,795, filed Jun. 28, 2004, entitled "Gallium Nitride Material Structures Including Isolation Regions and Methods", which is incorporated herein by reference above.

The above-described processes are used to form a semiconductor wafer including the desired material layers and features. The wafer may be further processed using conventional techniques to produced desired device structures. In some methods, the wafer may be thinned from its backside. A metallic layer (e.g., Au, Ti, Sn) may then be deposited on the backside. The wafer may be diced to form devices structure (e.g., die) which can be further processed. When mounting on a package, the device structures may be placed in the package and subjected to a heating step sufficient to weld the device structure to the packaging material. In other embodiments, the transistors are mounted to other entities (e.g., a heat sink) using known techniques.

It should be understood that the invention encompasses other methods than those specifically described herein. Also, variations to the methods described above would be known to those of ordinary skill in the art and are within the scope of the invention.

The following example is not limiting and are presented for purposes of illustration.

EXAMPLE 1

This example describes production and characterization of gallium nitride material devices implementing some of the aspects of the present invention, as well as a comparison to conventional gallium nitride material devices.

The devices in this example, Device A and Device B, comprised a gallium nitride material region of undoped III-N heterostructures grown on high resistivity Si (111) substrates by metal organic chemical vapor deposition. The devices were formed of transistor unit cells similar to those shown in cross-section in FIG. 1, though the unit cell layout in Devices A and B were different. Device A employed a standard transistor layout, while Device B employed a staggered transistor layout similar to that shown in FIG. 2A Device A included a single row of transistor cells with each transistor having a gate pitch of 30 micron. In Device B, the cells were arranged in two rows, providing room for a gate pitch of 50 µm. The increased gate pitch reduced thermal coupling, or interaction between adjacent heat sources (the active regions within the unit cells). In addition, there was a 300 µm inter-cell spacing in Device B to additionally reduce thermal coupling. Device A and Device B had the same total gate width.

Device A and Device B were both packaged. Device A was attached to a high thermal conductivity Cu—Mo laminate (CPC) single-ended ceramic package using a AuSi eutectic die attach process. Device B was attached to a high thermal conductivity pure copper (Cu) single-ended, ceramic package, using a AuSn eutectic die attach process. For both devices, the sources were grounded to the package base through backside vias in the silicon die. Device B include a silicon substrate thinned to about 100 micron, while Device A had a 150 micron thick silicon substrate. For both devices, a 2-stage internal matching network was used to transform the input impedance, while no intentional internal matching existed on the output.

The detailed characteristics of Device A and Device B are listed in Table I.

TABLE I

| Device Comparison | | |
|---|---|---|
| Quantity | Device A | Device B |
| Layout | Standard | Staggered Unit Cells |
| Total Gate Width | 36 mm | 36 mm |
| Unit Gate Width | 200 µm | 200 µm |
| Gate Pitch | 30 µm | 50 µm |
| Package Thermal Conductivity | 240 W/m-K (CPC) | 400 W/m-K (Cu) |
| Package Thickness | 1000 micron | 1000 micron |
| Si Thickness | 150 micron | 100 micron |
| Attach Material | AuSi | AuSn |
| Die Size | 1 × 6 mm | 1.2 × 6 mm |
| $R_{JC}$ | 1.95° C./W | 0.85° C./W |

The packaged devices were mounted to an aluminum-based fixture which functioned, in part, as a heat sink and infrared (IR) measurements were made using a Quantum Focus Instruments (QFI) InfraScope II thermal imaging system, available from Quantum Focus Instruments Corporation (Vista, Calif.). The dissipated power of the devices was produced by direct current (DC) for convenience. The drain voltage was held at 28V and the gate voltage was varied to achieve different drain current levels and hence different power dissipations. The heat sink temperature was maintained at 80° C. to reduce background radiant energy. First, an image using the 1× lens was taken to determine the location of peak channel temperature and to check the thermal distribution across the entire device. A 15× lens with ~2.5 µm spatial resolution was then used to obtain the peak channel temperature. The temperature at the back of the package was measured using a thermocouple passing through an aperture in the heat sink and contacting the bottom of the package. The thermal resistance was calculated from the channel to the back of the package/case ($R_{JC}$). Device A had a thermal resistance of 1.95° C./W and Device B had a significantly lower thermal resistance of 0.85° C./W.

RF measurements were made with a standard load pull system using Focus Microwaves, Inc. tuners. RF characteristics were taken at a drain voltage of 40V. The devices were biased in class AB with approximately 55 mA quiescent drain current and the impedances were optimized to obtain maximum RF output power.

Frequently, the limitation on the maximum operating temperature of a device is the requirement for mean time to failure (MTTF). Using a three-temperature DC life-test, a MTTF of >$10^7$ h was extrapolated at 150° C. for devices of the same variety as Device A of this study. The MTTF is >$10^5$ h at 200° C.

Figure 5:
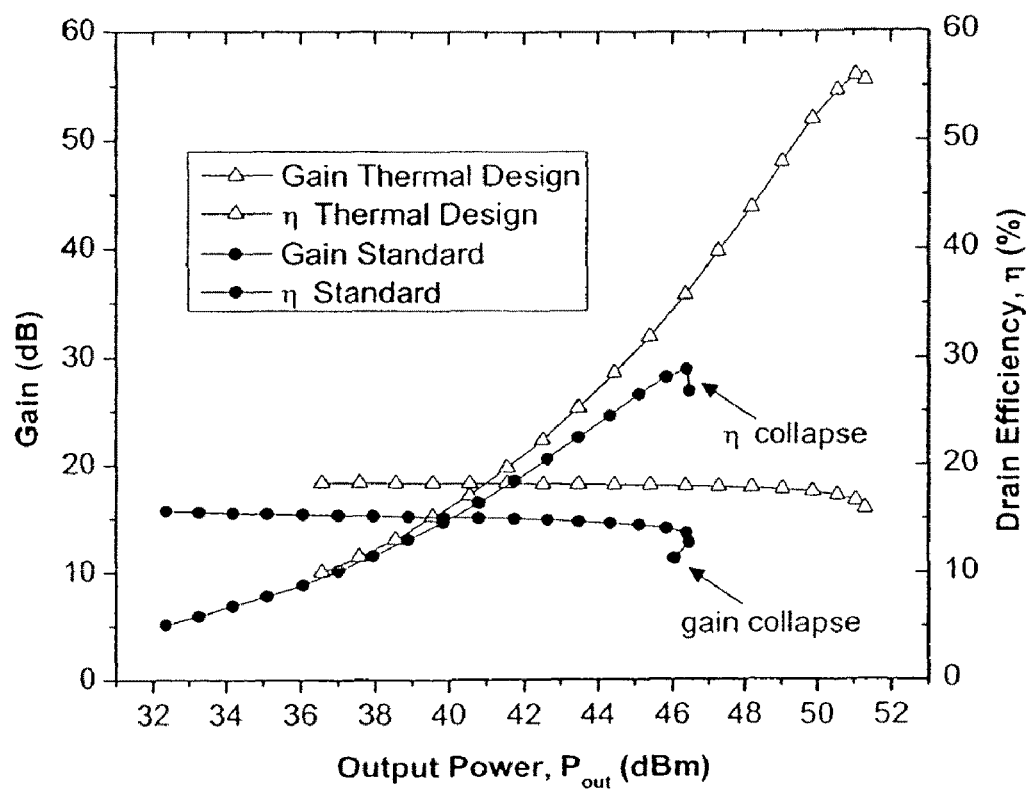
FIGS. 5 and 6 are graphs illustrating performance characteristics of Devices A and B, as described in Example 1.

The results of the measurements and calculations of Device A and Device B indicated that Device B offers improved thermal conduction, while providing excellent operating properties. When the peak channel temperature exceeded 225° C., the RF performance was noticeably affected. At this point, the heat generated at the channel was sufficient to raise a significant portion of the Si substrate to 175-200° C. The intrinsic carrier concentration, $n_i$, of Si at 200° C. is $8.9\times10^{13}$ cm$^{-3}$. This carrier concentration corresponds to an n-type resistivity of approximately 50 ohm-cm. As a large enough portion of the substrate becomes less resistive, the onset of significant RF loss was seen. FIG. 5 illustrates RF performance of Device A (closed circles) and Device B (open triangles). Collapse of the efficiency and gain for Device A was seen at an output power of about 46 dBm (about 40 W). Device B achieved about 51 dBm (about 126 W) with 56% efficiency without collapse, demonstrating the benefits of the thermal design of Device B.

Figure 6:
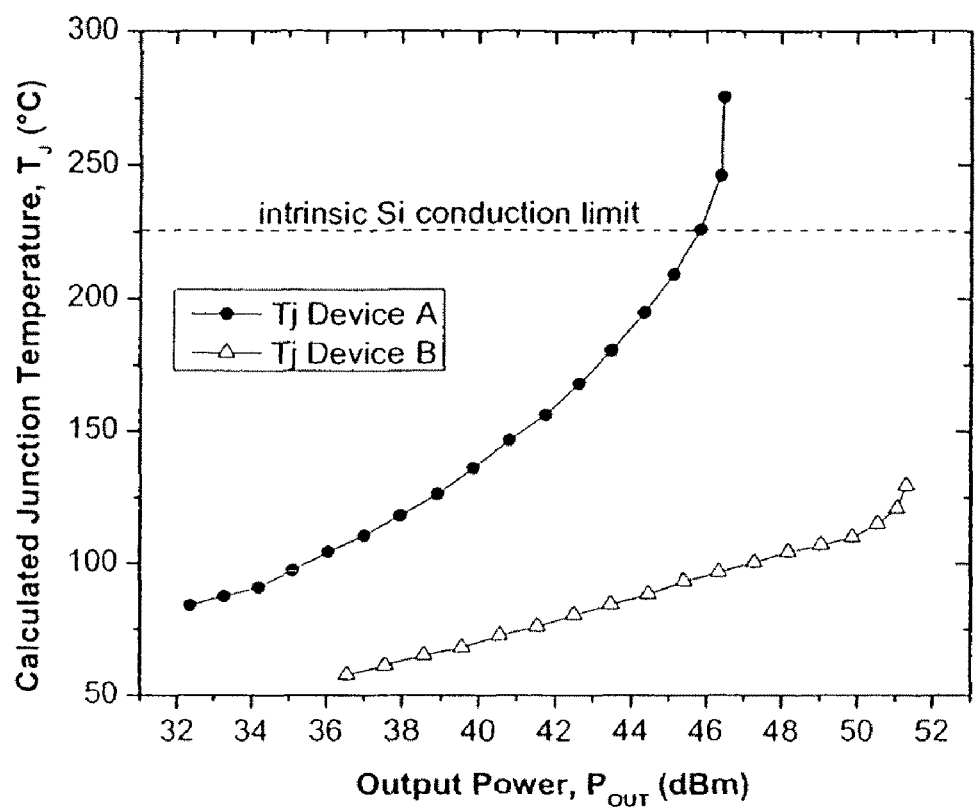

FIG. 6 shows the corresponding calculated channel temperature for Devices A and B. The closed circles correspond to Device A and the open triangles correspond to Device B. The temperature of the points shown in the graph is calculated using the measured output power, gain, efficiency, and the thermal resistance obtained from IR measurement and simulation.

Device A in this study, a design intended to meet WiMax application specific linearity requirements, was operated in a severely backed-off condition producing only 18% drain efficiency (DE) and 6 W output power ($P_{OUT}$) under operation. The typical power gain, G, is 12 dB for the WiMax design, or 15.83 on a linear scale. The dissipated power ($P_D$) is thus $P_D = P_{OUT}*(1/G+1/DE-1) = 27.7$ W. Using the maximum rated thermal resistance of 1.95° C./W for this part, the temperature drop from channel to case was $\Delta T_{JC} = P_D*R_{JC} = 54°$ C. Assuming a case temperature of 90° C., this placed the channel near the 150° C. operating temperature target. If Device A is operated with a continuous waveform (CW) it is capable of 65 W with 45% efficiency and 9.5 dB of gain. The dissipated power of $P_D = 86.7$ W results in a temperature rise of $\Delta T_{JC} = 169°$ C. When Device A was operated CW, with a case temperature of 90° C., the device clearly exceeded the thermal limit of 225° C. and suffered from reduce RF performance. A device such as Device B in this study which possesses a 0.85° C./W thermal resistance has a $\Delta T_{JC} = 73.7°$ C. for the same CW performance levels. Device B would only have a junction temperature of ~165° C. when operated under CW conditions and with 90° C. case temperature. The improved thermal performance of Device B allows it to operate with good RF performance and with an acceptable MTTF even under the most stringent conditions of CW operation and elevated case temperature.

Therefore, this example demonstrates the benefits obtained in terms of thermal conduction through and out of the device and electrical performance by utilizing aspects of the present invention in a gallium nitride material device.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A packaged gallium nitride material device comprising:
   a package having a bowed convex shape; and
   a gallium nitride material device comprising at least one transistor structure including a gallium nitride material region and source, gate and drain electrodes, the gallium nitride material device having a total gate width of at least 36 mm;
   the gallium nitride material device being supported by the package;
   wherein the packaged device is configured to have a total thermal resistance of less than 1.5° C./W.

2. A packaged gallium nitride material device comprising:
   a package having a bowed convex shape; and
   a gallium nitride material device comprising at least one transistor structure including a gallium nitride material region and source, gate and drain electrodes, the gallium nitride material device having a total gate width of at least 10 mm;
   the gallium nitride material device being supported by the package;
   wherein the packaged device is configured to have a total thermal resistance of less than 4.0° C./W.

3. A packaged gallium nitride material device comprising:
   a package including a supporting portion consisting essentially of copper; and
   a gallium nitride material device comprising at least one transistor structure including an active region formed in a gallium nitride material region over a substrate, said substrate being directly on said supporting portion of said package;
   wherein the gallium nitride material device is supported by and electrically insulated from the supporting portion of the package.

4. The device of claim 3, wherein the device is attached to the supporting portion via a gold-tin eutectic layer.

5. The device of claim 3, wherein the substrate has a thickness less than approximately 100 microns.

6. The device of claim 3, wherein the substrate is a silicon substrate.

7. The device of claim 3, wherein the device is attached to the supporting portion via a gold-silicon eutectic.

8. A method of packaging a gallium nitride material device, comprising:
   forming a gallium nitride material device comprising at least one transistor structure including a gallium nitride material region over a substrate; and
   attaching the substrate to a pre-bowed copper material package.

9. The method of claim 8, wherein said substrate is attached to said pre-bowed copper material package via a gold-tin eutectic layer.

10. The method of claim 8, wherein said substrate has a thickness less than approximately 100 microns.

11. The method of claim 8, wherein said substrate is a silicon substrate.

12. The method of claim 8, wherein said substrate is attached to said pre-bowed copper material package via a gold-silicon eutectic.

13. The method of claim 8, wherein a total gate width of said at least one transistor structure is at least 36 mm.

14. The method of claim 8, wherein a total gate width of said at least one transistor structure is at least 10 mm.

15. The method of claim 8, wherein the packaged device is configured to have a total thermal resistance of less than 1.5° C./W.

16. The method of claim 8, wherein the packaged device is configured to have a total thermal resistance of less than 4.0° C./W.

* * * * *